(12) United States Patent
Zhang

(10) Patent No.: US 7,658,111 B2
(45) Date of Patent: *Feb. 9, 2010

(54) SENSORS WITH HIGH TEMPERATURE PIEZOELECTRIC CERAMICS

(75) Inventor: Hongxi Zhang, San Juan Capistrano, CA (US)

(73) Assignee: Endevco Corporation, San Juan Capistrano, CA (US)

(*) Notice: Subject to any disclaimer, the term of this patent is extended or adjusted under 35 U.S.C. 154(b) by 53 days.

This patent is subject to a terminal disclaimer.

(21) Appl. No.: 11/941,785

(22) Filed: Nov. 16, 2007

(65) Prior Publication Data

US 2008/0134795 A1    Jun. 12, 2008

Related U.S. Application Data

(60) Provisional application No. 60/866,108, filed on Nov. 16, 2006.

(51) Int. Cl.
*G01L 9/08* (2006.01)
(52) U.S. Cl. ...................................... 73/723
(58) Field of Classification Search .............. None
See application file for complete search history.

(56) References Cited

U.S. PATENT DOCUMENTS

| | | | |
|---|---|---|---|
| 3,649,539 A | 3/1972 | Apfel et al. | |
| 5,739,626 A * | 4/1998 | Kojima et al. | 310/360 |
| 6,093,338 A * | 7/2000 | Tani et al. | 252/62.9 R |
| 6,218,233 B1 | 4/2001 | Takemura et al. | 438/240 |
| 6,692,652 B2 * | 2/2004 | Takao et al. | 252/62.9 R |
| 7,152,482 B2 * | 12/2006 | Ueno et al. | 73/723 |
| 7,215,067 B2 * | 5/2007 | Ifuku et al. | 310/357 |
| 7,267,783 B2 * | 9/2007 | Nonoyama et al. | 252/62.9 R |
| 7,313,965 B2 * | 1/2008 | Tilak et al. | 73/705 |
| 7,470,390 B2 * | 12/2008 | Nakamura et al. | 264/672 |
| 7,508,120 B2 * | 3/2009 | Akiyama et al. | 310/358 |
| 2001/0004470 A1 | 6/2001 | Hintermaier et al. | |
| 2005/0082948 A1 * | 4/2005 | Waki et al. | 310/329 |
| 2006/0006360 A1 * | 1/2006 | Takao et al. | 252/62.9 R |
| 2006/0144154 A1 * | 7/2006 | Ueno et al. | 73/723 |
| 2006/0283255 A1 * | 12/2006 | Tilak et al. | 73/705 |
| 2007/0013014 A1 * | 1/2007 | Guo et al. | 257/417 |

(Continued)

OTHER PUBLICATIONS

Takeda, et al., "Enhanced piezoelectric properties of off-stoichiometric strontium bismuth tantalite $Sr_{0.8}Bi_{2.2}Ta_2O_9$ ceramics", Applied Physics, 81, pp. 131-135, (2005).

(Continued)

*Primary Examiner*—Lisa M Caputo
*Assistant Examiner*—Freddie Kirkland, III
(74) *Attorney, Agent, or Firm*—Paul Davis; Goodwin Procter LLP

(57) ABSTRACT

A piezoelectric sensor includes a ceramic material that has the formula of $[Bi_2O_2][A_{m-1}B_mO_{3m+1}]$, where m=2, A is mono-, di-, or tri-valent ions or a combination of them, B is transition element such as $Fe^{3+}$, $Ti^{4+}$, $Nb^{5+}$, $Ta^{5+}$, $W^{6+}$, $Mo^{6+}$ or a combination of them. The ceramics have high Curie temperature of 900~940° C. The sensors claimed in the present invention utilize $[Bi_2O_2][A_{m-1}B_mO_{3m+1}]$ ceramics parts as sensing elements in various shapes and dimensions and can be used to sense force, acceleration, and pressure at very high temperatures of 600~800° C.

22 Claims, 6 Drawing Sheets

U.S. PATENT DOCUMENTS

2008/0018714 A1* 1/2008 Domoto et al. ............... 347/70
2008/0129150 A1* 6/2008 Zhang ........................ 310/329
2008/0271300 A1* 11/2008 Nihei ........................ 29/25.35
2009/0108382 A1* 4/2009 Eriksen et al. ............. 257/419

OTHER PUBLICATIONS

Yan, et al., "B-site donor and acceptor doped Aurivillius phase $Bi_3NbTiO_9$ ceramics", Journal of the European Ceramic Society, 26, pp. 2785-2792, (2006).

* cited by examiner

SENSORS WITH HIGH TEMPERATURE PIEZOELECTRIC CERAMICS

CROSS-REFERENCE TO RELATED APPLICATION

This application claims the benefit of U.S. Ser. No. 60/866,108, filed Nov. 16, 2006, which application is fully incorporated hereby reference.

BACKGROUND OF THE INVENTION

1. Field of the Invention

The present invention relates to piezoresistive sensors, and more particularly to sensors that have a ceramic with a formula of $[Bi_2O_2][A_{m-1}B_mO_{3m+1}]$ (m=2, A is mono-, di-, or trivalent ions or a combination of them. B is transition elements such as $Fe^{3+}$, $Ti^{4+}$, $Nb^{5+}$, $Ta^{5+}$, $W^{6+}$, $Mo^{6+}$ or a combination of them) and the sensors that utilize $[Bi_2O_2][A_{m-1}B_mO_{3m+1}]$ as sensing elements and can be used to sense acceleration, shock, force, and pressure at very high temperatures.

2. Description of the Art

Piezoelectric materials including single crystals, polycrystalline ceramics, and thin films that deposited on various substrates have been used for the measurements of acceleration, pressure, and force in different application environmental conditions. When piezoelectric elements are strained by an external force or pressure, displaced electrical charge accumulates on opposing surfaces. This electrical charge can be tested and used to measure the amount of pressure, force, and acceleration that the object experiences.

Piezoelectric sensors have been developed using materials such as quartz crystal and polycrystals such as lead zirconium titanate (PZT) ceramics. However, the piezoelectric materials have not been suitable for use at high temperatures. The maximum operation temperature of the sensors made from such materials is limited by their phase transition temperature or/and Curie temperature Tc. For example, the operation temperatures of the existing sensors based on quartz are around 150° C. due to the phase change at higher temperature. PZT ceramics has Tc of ~300° C. and the operation temperatures of the sensors are limited at ~200° C. Bismuth titanate $(Bi_4Ti_3O_{12})$ ceramics has a Tc of ~650° C. and the sensors can work at a temperature of ~450° C. Composition modified bismuth titanate ceramics can have a Tc of ~800° C. and the sensors made of the material can survive at ~500° C.

More and more gas engines and weapon platforms will operate at higher temperatures and, due to the lack of high temperature sensors, significant amount of design goes to isolating the sensors and the sources of heat. Accordingly, there is a need for piezoelectric sensors with an extended temperature range that can be used to measure acceleration, force, and pressure to improve the efficiency of the fuels, decrease system weight, and reduce cost.

If the piezoelectric elements within a sensor have low electrical resistivity, the generated charge rapidly drains away and electronic detection of the charge is therefore compromised. Hence, a high electrical resistivity is desirable especially for low frequency applications.

Polycrystalline $[Bi_2O_2][A_{m-1}B_mO_{3m+1}]$ (m=2) ceramics has very high Curie temperature (>900° C.) and very good processability. Their piezoelectric response and resistivity can be greatly improved by donor doping. Thus the need for high temperature dynamic measurement of force, pressure, and acceleration can be met by the claimed piezoelectric materials and the sensors made of the same.

In pressure and acceleration sensors, it is desired to produce a relatively large signal power from a relatively small amount of energy absorbed from the medium. The goal is to minimize the mechanical energy necessary to produce a desired output signal. In pressure sensors, energy is absorbed from the medium as pressure deflects a diaphragm. Generally, a bar deeply notched at the center and its ends is placed across a diaphragm. Gages are placed on the plane surface opposite the notched bottoms. The strain of the bending bar is concentrated at the bottom of the notches. In acceleration sensors, energy is absorbed from the acceleration field as the seismic mass deflects relative to its reference frame. For example, a structure that is used features gages that are etched free from the substrate over an elastic hinge, a so-called "freed-gage." With the hinge carrying the transverse load and the gages much further from the neutral axis of bending than the outer surfaces of the hinge, the gages become the most highly strained material. In both the acceleration and pressure sensor, efficiency permits high sensitivity via a small physical size.

A common approach taken by manufacturers of transducers has been to create a large field of strained surface and to place onto the more strained areas strain gages of a convenient size. Alternatively, structural means have been used to concentrate strain in piezoresistors. In piezoresistive sensors, signal is produced by changing the resistance of one or more strain-sensitive resistors excited by an electric current. Hence, in a simple plane diaphragm pressure sensor with embedded gages, much of the periphery and a broad area of the center are brought to the state of strain needed to provide signal in the gages. Although gages are placed in areas of highest strain, much of the strain energy is expended in the periphery and center areas which lack strain gages.

In a freed-gage structure only the piezoresistive material sees the full level of strain; the hinge and force-gathering structures are much less strained. Though the freed strain gage was an improvement over previous strain gages, it is still not the optimal structure to detect strain. Manufacturing tolerances impose a minimum cross section on the freed-gage; hence, for the required signal power, some minimum amount of material must be strained.

Pressure sensors are used in a variety of areas, such as automotive and industrial applications, to provide an electrical signal corresponding with a measured fluid pressure. For example, pressure sensors can be used to measure automotive oil pressure and hydraulic fluid pressure.

Ceramic sensors typically have a ceramic element that undergoes a change in an electrical characteristic in response to a change in a detected parameter. Ceramic pressure-measuring cells are advantageously used in pressure measurement technology, since ceramic pressure-measuring cells have a measuring accuracy which is stable over a very long time. One reason for this is the solid ionic bonding of ceramic, which makes the material very durable and undergo virtually no ageing in comparison with other materials, for example metals. However, in comparison with metal, ceramic pressure sensors have a rougher surface and are often restrained by means of a generally nonreplaceble seal made of an organic material, for example an elastomer, in a pressure-tight manner in a housing which can then be fastened at a measuring location by means of a process connection.

There is a need for improved piezoresistive sensors that have ceramic elements.

SUMMARY OF THE INVENTION

An object of the present invention is to provide a sensor that has a ceramic made of material with the general formula of $[Bi_2O_2][A_{m-1}B_mO_{3m+1}]$, where m=2, A is mono-, di-, or trivalent ions or a combination of them, B is transition elements such as $Fe^{3+}$, $Ti^{4+}$, $Nb^{5+}$, $Ta^{5+}$, $W^{6+}$ $Mo^{6+}$ or a combination of them and the like.

Another object of the present invention is provide a sensor that has a ceramic with a composition modified as $[Bi_2O_2][A_{m-1}B_{m-x}M_xO_{3m+1}]$ to improve their piezoelectric response and resistivity, where M is donor dopant or combination of different dopants. x is the molar fraction of the dopant or the combinations of dopants. x is in the range of 0~15 mol. %.

In one embodiment of the present invention, a piezoelectric sensor includes a housing and a diaphragm coupled to the housing. A ceramic body is coupled to the diaphragm. The ceramic body being is made of a composition with the formula of $[Bi_2O_2][A_{m-1}B_mO_{3m+1}]$, where m=2, A is a mono-, di-, or trivalent ion or a combination thereof, and B is a transition element. A connector electrically connects the ceramic body with a source of electric current.

In another embodiment of the present invention, a piezoelectric sensor includes a housing and a diaphragm coupled to the housing. A ceramic body is coupled to the diaphragm. The ceramic body is made of a BLSP material of the formula $CaBi_2Nb_{2-x}M_xO_9$; wherein M=W, Mo, or their combination and x=0-0.15. A connector electrically connects the ceramic body with a source of electric current.

In another embodiment of the present invention, a piezoelectric sensor includes a housing and a diaphragm coupled to the housing. A ceramic body is coupled to the diaphragm. The ceramic body is made of a BLSP material of the formula $B_3Ti_{1-x}Nb_{1-y}M_xN_yO_9$; wherein M=Nb, Ta, W, Mo or their combinations and N=W, Mo or their combinations. A connector electrically connects the ceramic body with a source of electric current.

In another embodiment of the present invention, a sensor subassembly includes a mass, a support structure and a BLSP ceramic. The ceramic has a formula of $[Bi_2O_2][A_{m-1}B_mO_{3m+1}]$, where m=2, A is a mono-, di-, or trivalent ion or a combination thereof, and B is a transition element, the ceramic being mounted at the support structure with a support member. First and second electrodes are coupled to the ceramic. A first insulator is positioned between the second electrode and the support member to isolate the ceramic and the support structure. A second insulator is positioned to insulate the ceramic and the mass.

BRIEF DESCRIPTION OF THE DRAWINGS

FIG. 3 also shows that the piezoelectric charge coefficients of the ceramics is greatly improved from 3.5 pC/N for undoped material to 10.2 pC/N for the doped material.

DETAILED DESCRIPTION

Figure 1:
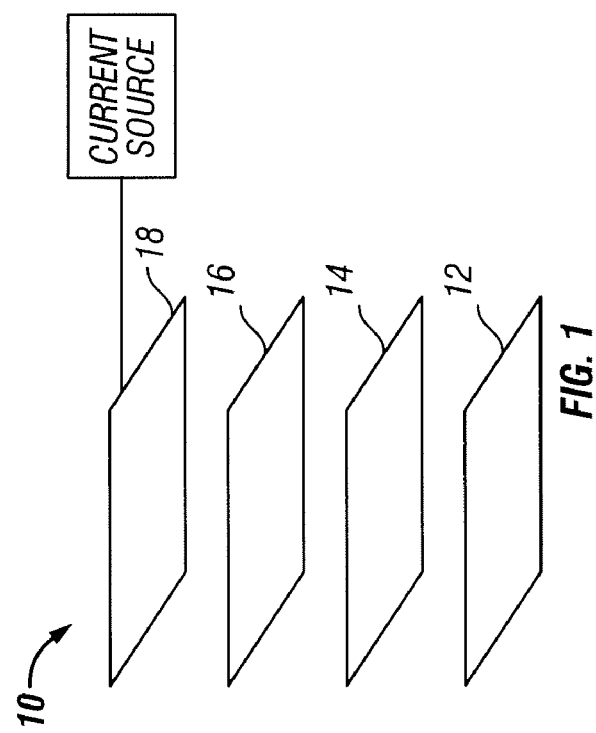
FIG. 1 is an exploded diagram illustrated one embodiment of a sensor of the present invention.

Referring to FIG. 1, one embodiment of the present invention is a piezoelectric sensor 10 includes a housing 12 and a diaphragm 14 coupled to the housing 12. A ceramic body 16 is coupled to the diaphragm. The ceramic body being is made of a composition with the formula of $[Bi_2O_2][A_{m-1}B_mO_{3m+1}]$, where m=2, A is a mono-, di-, or trivalent ion or a combination thereof, and B is a transition element. A connector 18 electrically connects the ceramic body with test electronic.

In another embodiment of the present invention, the ceramic body 16 is made of a BLSP material of the formula $CaBi_2Nb_{2-x}M_xO_9$; wherein M=W, Mo, or their combination and x=0-0.15.

In another embodiment of the present invention, the ceramic body 16 is made of a BLSP material of the formula $B_3Ti_{1-x}M_xN_yO_9$; wherein M=Nb, Ta, W, Mo or their combinations and N=W, Mo or their combinations.

Figure 2:
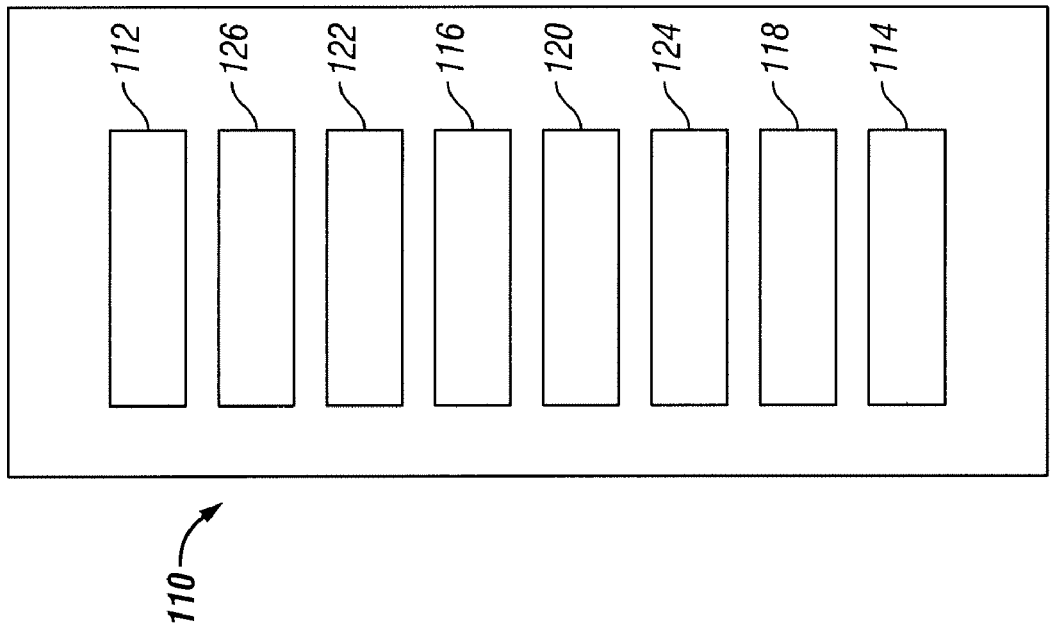
FIG. 2 is an exploded diagram illustrating one embodiment of a sensor subassembly of the present invention.

Referring now to FIG. 2, a sensor subassembly 110 includes a mass 112, a support structure 114 and a BLSP ceramic 116. The ceramic 116 has a formula of $[Bi_2O_2][A_{m-1}B_mO_{3m+1}]$, where m=2, A is a mono-, di-, or trivalent ion or a combination thereof, and B is a transition element. The ceramic 116 is mounted at the support structure 114 with a support member 118. First and second electrodes 120 and 122 are coupled to the ceramic 116. A first insulator 124 is positioned between the second electrode 122 and the support member 118 to isolate the ceramic 116 and the support structure 114. A second insulator 126 is positioned to insulate the ceramic and the mass.

In one of the embodiments of the present invention, a new family of high temperature bismuth layer structured perovskite piezoelectric materials is provided for the sensor. The materials have the general formula of $[Bi_2O_2][A_{m-1}B_mO_{3m+1}]$, where m=2, A is mono-, di-, or tri-valence ions or a combination of them, B is transition element such as $Fe^{3+}$, $Ti^{4+}$, $Nb^{5+}$, $Ta^{5+}$, $W^6+Mo^{6+}$ or a combination of them and the like.

In another embodiment of the present invention, the materials can be composition modified as $[Bi_2O][A_{m-1}B_{m-x}M_xO_{3m+1}]$, where M is donor dopant or combination of different dopants. x is the molar fraction of the dopant or the combinations of dopants. x is in the range of 0~15 mol. %.

In another embodiment of the present invention, a process is developed to manufacture the ceramic materials. The polycrystalline ceramics of the present invention can be prepared through the following procedure. By way of example, the powders with the BLSP structure can be prepared using solid state reaction of the appropriate amount of oxides and/or carbonates. $Bi_2O_3$, $TiO_2$, $Nb_2O_5$, $CaCO_3$, $Ta_2O_5$, $WO_3$, $MoO_3$, are weighed out and intimately mixed by wet or dry ball milling, or high-energy mechanochemical milling. This mixing is followed by calcination, which is the thermal process whereby the interdiffusion of cations and anions takes place to achieve the desired BLSP phase, as determined by x-ray diffraction method. The calcined powder is subsequently milled to enhance the powder reactivity and pressed into ceramics parts with desired shapes of specific dimensions. The ceramics parts are sintered for densification, lapped or fine ground, coated with electrodes, and then exposed to a DC electric field required to achieve maximum polarization, i.e., maximum alignment of the poles of the polycrystalline structure, which results in optimum piezoelectric properties.

Figure 3:
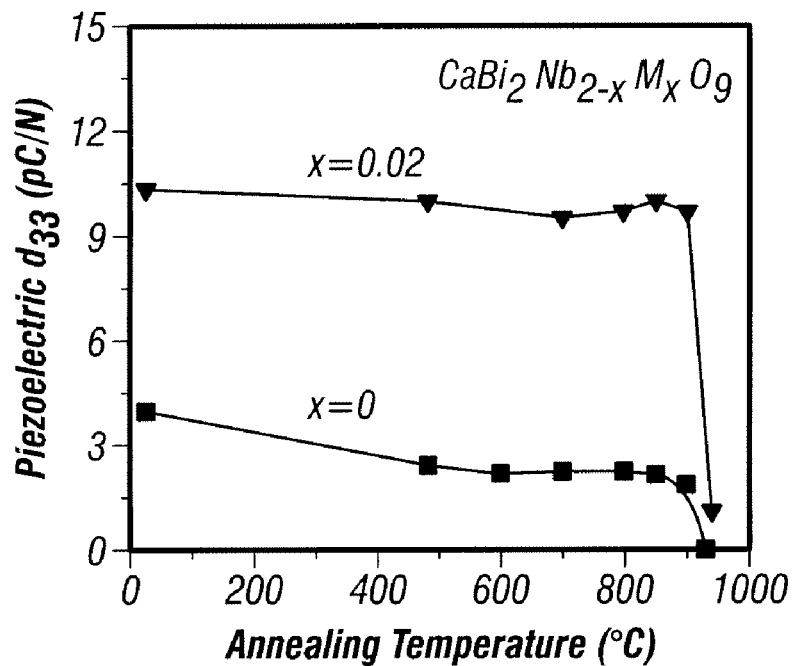
FIG. 3 demonstrates the dependence of piezoelectric charge coefficient $d_{33}$ of $CaBi_2Nb_{2-x}M_xO_9$ on annealing temperature in the first embodiment of the present invention, showing that the material has a high Curie temperature of ~940° C.
Figure 4:
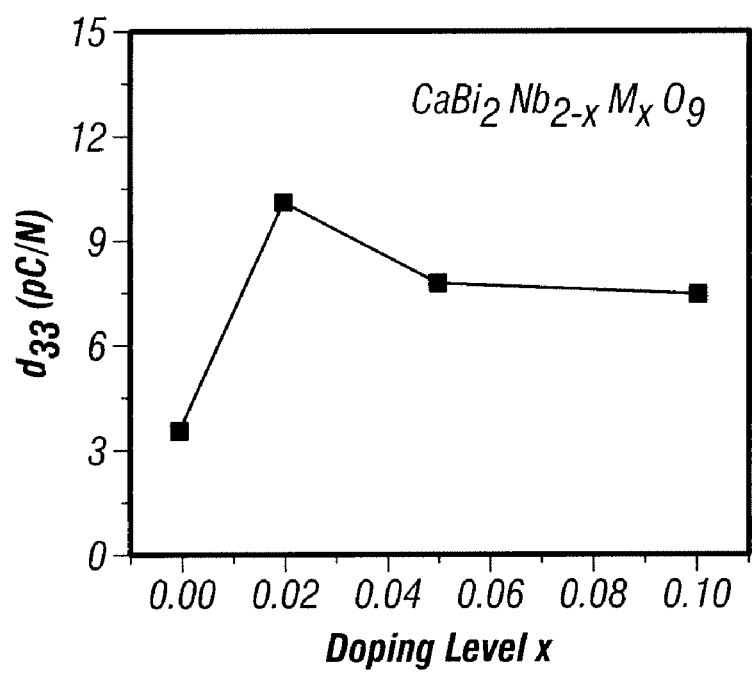
FIG. 4 demonstrates the dependence of piezoelectric charge coefficient $d_{33}$ of the material on doping concentrations.
Figure 5:
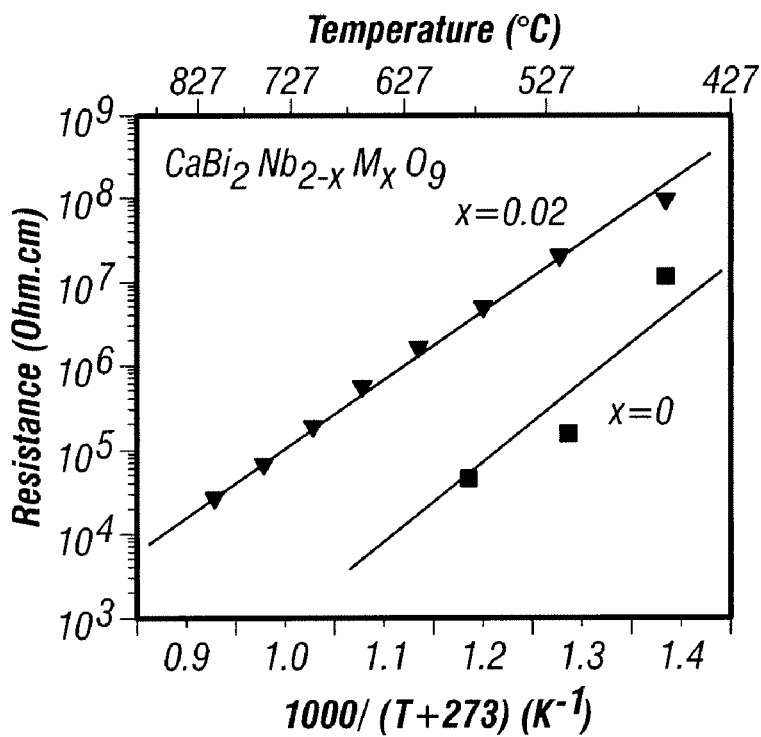
FIG. 5 shows the dependence of the resistivity of the material on temperature for x=0 and x=0.02, respectively.

One of the embodiments of the present invention is directed to a BLSP material of the formula $CaBi_2Nb_{2-x}M_xO_9$, where M=W, Mo, or their combination, x=0~0.15. The piezoelectric coefficient $d_{33}$ was measured with a sensitive $d_{33}$ meter to be 3.5~10.2 pC/N depending on the concentration of the dopants and the poling conditions. The dependence of the $d_{33}$ on annealing temperature of the ceramics is indicated in FIG. 3, showing that the materials have a Curie temperature of up to ~940° C. FIG. 4 shows the dependence of $d_{33}$ on the doping concentrations. The increase of resistivity of the material with doping is illustrated in FIG. 5.

Figure 6:
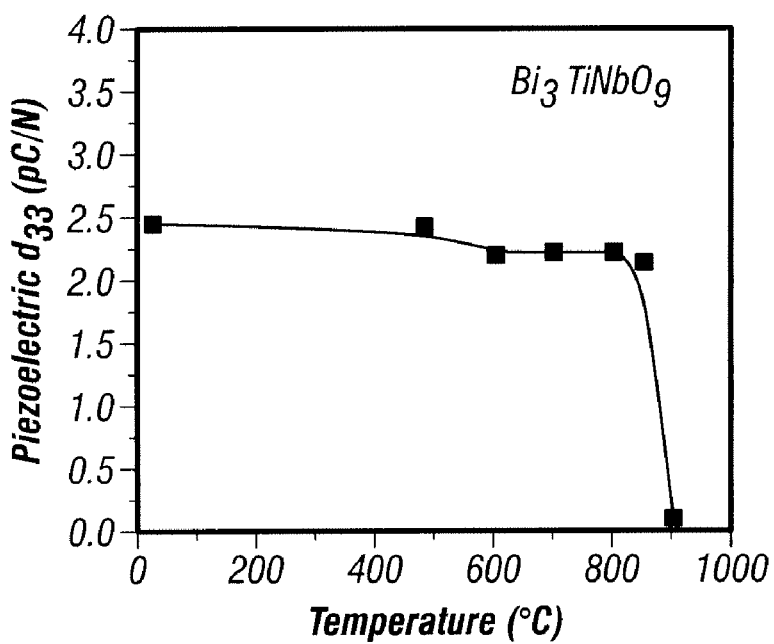
FIG. 6 demonstrates the dependence of $d_{33}$ of another material $B_3Ti_{1-x}Nb_{1-y}M_xN_yO_9$ on annealing temperature in one of the embodiment of the present invention, showing the material has a high Curie temperature of ~900° C.

One of the embodiments of the present invention is directed to a BLSP material of the formula $B_3Ti_{1-x}Nb_{1-y}M_xN_yO_9$, where M=Nb, Ta, W, Mo or their combinations, N=W, Mo or their combinations. The piezoelectric coefficient $d_{33}$ was measured with a sensitive $d_{33}$ meter to be 2~5 pC/N depending the concentration of the dopants and the poling conditions. The dependence of the $d_{33}$ of materials on annealing temperatures is demonstrated in FIG. 6, showing that the materials have a Curie temperature of up to 900° C.

One of the embodiments of the present invention is to demonstrate that the piezoelectric charge coefficient and electrical resistivity can be modified by doping. For example, the piezoelectric charge coefficient $d_{33}$ of $CaBi_2Nb_{2-x}M_xO_9$ is only 3.5 pC/N for x=0 (no doping), while the $d_{33}$ is greatly increased to over 10 pC/N for x=0.02.

One of the embodiments of the present invention is to demonstrate that the resistivity of the ceramics can also be increased by doping. For example, the resistance of $CaBi_2Nb_{2-x}M_xO_9$ at 500° C. is increased from $10^5$ Ω·cm for x=0 to $10^7$ Ω·cm for x=0.02.

In one of the embodiments, the ceramics parts or their stacks are mounted onto a crystal support with a post, a mass made of high temperature metals and alloys is brought onto the top of the stack, and then fixed with a nut, also made of high temperature metals and alloys. Insulators are put on both the bottom and top of the ceramics parts or their stack to isolate the ceramics parts and the crystal support/mass. Spacers are used to compensate the expansion mismatch between the ceramics parts or their stack and the metal post. A preload is applied to the pack to allow appropriate sensitivity output. The subassembly thus obtained is put into metal case and then hermetically sealed to form a sensor package. All the metal components used in the packaging are made of high temperature metals or alloys such as Inconel etc. The sensor can be used to measure the vibration and acceleration at very high temperatures.

Figure 7:
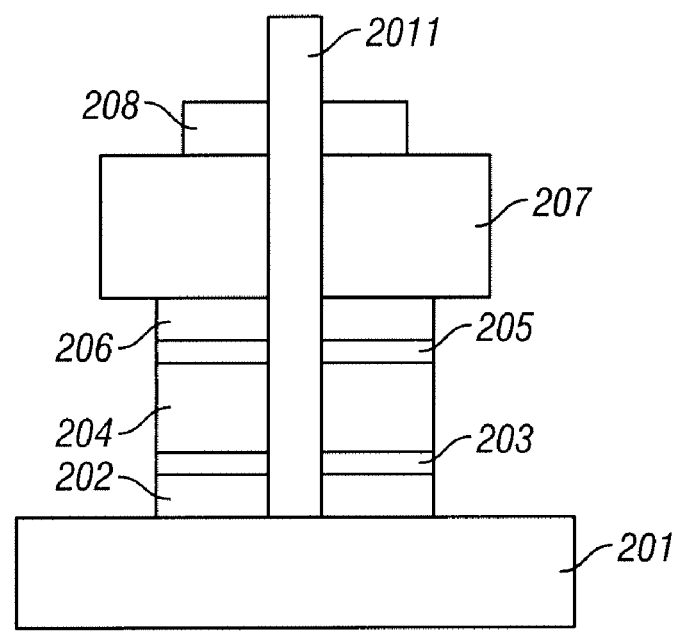
FIG. 7 is a side view of an accelerometer subassembly in one of the embodiments that is made of the materials in the present invention.

As shown in FIG. 7, the side view of an accelerometer subassembly, one of the embodiments of the present invention, the ceramics part or the stack of a few ceramics parts 204 with bottom electrode 203 and top electrode 205 is mounted on crystal support 201 with post 2011. An insulator 202 is put between the bottom electrode 203 of the ceramics part or ceramics stack 204 and crystal support 201 to isolate the ceramic part 204 and the crystal support 201. Another insulator 206 is used to isolate the ceramics part or ceramics stack 204 and the mass 207. A nut 208 is used to fix the mass 207, insulators 202 and 206, and ceramics part or stack 204 onto the crystal support 201 through post 2011. The obtained subassembly is installed into a case made of high temperature metals or alloys and then hermetically sealed. The performance of the accelerometer is can be tested on specially designed shakers and measurement consoles to determine the output sensitivity, frequency response, transverse sensitivity, and the thermal stabilities in sensitivity, resistance, and capacitance.

In another embodiment, the ceramics parts or their stacks are mounted onto a crystal support and then fixed with a nut. Insulators are put on both the bottom and top of the ceramics parts or their stack to isolate the ceramics parts and the crystal support/mass. Spacers are used to compensate the expansion mismatch between the ceramics parts or their stack and the crystal support. A preload is applied to the pack to allow appropriate sensitivity output. The subassembly thus obtained is put into metal case; a cover made of metal is brought to close contact onto the top of the ceramics parts or their stack and then hermetically sealed to form a sensor package. The backside of the metal cover is exposed to the outside atmosphere so that the sensor can sense the pressure and force. All the metal components used in the packaging are made of high temperature alloys such as Inconel etc. The sensor can be used to measure the force and pressure at very high temperatures.

Figure 8:
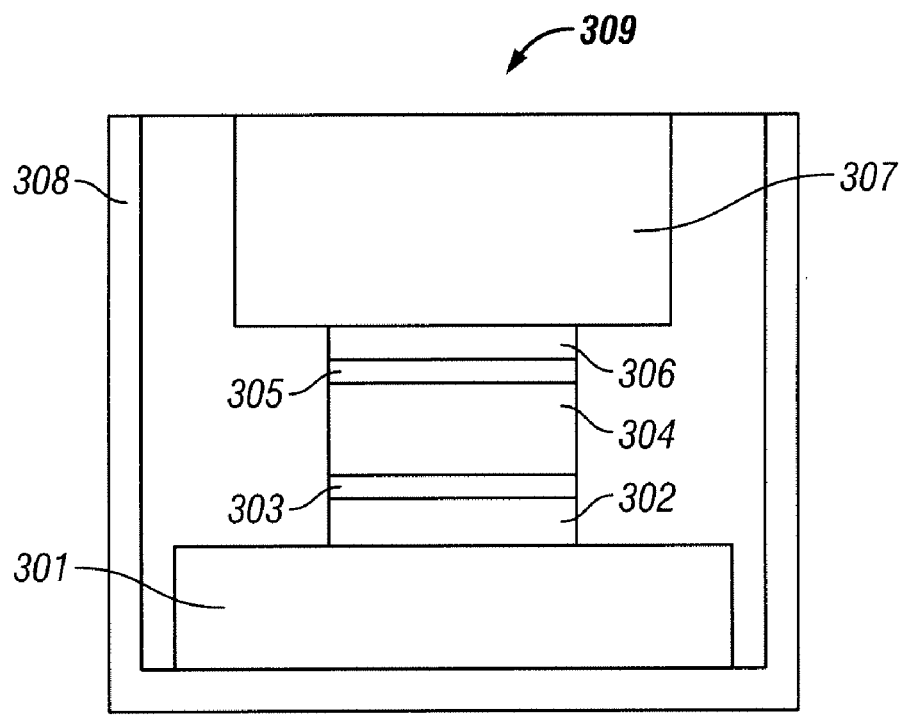
FIG. 8 illustrates the side view of a pressure sensor subassembly in one of the embodiments that is made of the materials in the present invention.

As shown in FIG. 8, the side view of an pressure and force sensor in one of the embodiments of the present invention, ceramics part or stack of a few ceramics parts 304 with bottom electrode 303 and top electrode 305 is mounted on crystal support 301. An insulator 302 is put between the bottom electrode 303 of the ceramics part or stack 304 and the crystal support 301 to isolate the ceramic part or stack 304 and the crystal support 301. Another insulator 306 is used to isolate the ceramics part or stack 304 and the mass 307. The mass 307 is sealed with the case 308 of the sensor and its backside 309 is exposed to the environment where the sensor is to be used. The performance of the pressure sensor can be tested on a specially designed chamber to determine the output sensitivity, frequency response, and thermal stability in sensitivity and other performance.

EXAMPLE 1

In one of the embodiments of the present invention, the ceramics with the formula of $CaBi_2Nb_{2-x}M_xO_9$ is processed as follows. 1397.9 grams of $Bi_2O_3$, 300.3 grams of $CaCO_3$, 797.4 grams of $Nb_2O_5$, and 0~69.6 grams of dopants were weighed and transferred into ball milling jar for mixing for 2.0 to 8.0 hours. The mixed powders were then transferred into alumina crucible and calcined at 850~1100° C. for 1.0 to 3.0 hours. The calcined powders were examined with an X-ray diffractometer to confirm the formation of pure BLSP phase. The calcined powders were mixed with binder polymer in a weight percent of 5~10% and then dried at 100° C. for 24 hours. Then the dried composites were pressed into parts that have different shapes with various dimensions. The parts were sintered at 1100~1250° C. for 1.0 to 4.0 hours to burn out the polymer and densify the structure to desired density of 96.0%~98.0% of the theoretical density. After lapping and being pasted with electrodes, the parts were poled at 150~200° C. for 1.0 to 2.0 hours to align the polarization of the polycrystalline grains along the direction of the applied electric field. The piezoelectric coefficient $d_{33}$ was measured with a sensitive $d_{33}$ meter to be 3.5~10.2 pC/N depending on the concentration of the dopants and the poling conditions. The dependence of the $d_{33}$ on annealing temperature of the ceramics is indicated in FIG. 3, showing that the materials have a Curie temperature of up to ~940° C. FIG. 4 shows the dependence of $d_{33}$ on the doping concentrations. The increase of resistivity of the material with doping is illustrated in FIG. 5.

EXAMPLE 2

In one of the embodiments of the present invention, the ceramics with the formula $B_3Ti_{1-x}Nb_{1-y}M_xN_yO_9$ is processed as follows. 1398.0 grams of $Bi_2O_3$, 239.7 grams of $TiO_2$, 797.4 grams of $Nb_2O_5$, and 0~69.6 grams of dopant were weighed and transferred into ball milling jar for mixing for 2.0 to 8.0 hours. The mixed powders were then transferred into alumina crucible and calcined at 850~1100° C. for 1.0 to 3.0 hours. The calcined powders were examined with X-ray diffractometer to confirm the formation of pure BLSP phase. The calcined powders were mixed with binder polymer in a weight percent of 5~10% and then dried at 100° C. for 24 hours. Then the dried composite were pressed into parts that have different shapes with various dimensions. The parts were sintered at 1100~1250° C. for 1.0 to 4.0 hours to burn out the polymer and densify the structure to desired density of 96.0%~98.0% of the theoretical density. After lapping and being pasted with electrodes, the parts were poled at 150~200° C. for 1.0 to 2.0 hours to align the polarization of the polycrystalline grains along the direction of the applied electric field. The piezoelectric coefficient $d_{33}$ was measured with a sensitive $d_{33}$ meter to be 2~5 pC/N depending the concentration of the dopants and the poling conditions. The dependence of the $d_{33}$ of materials on annealing temperatures is demonstrated in FIG. 6, showing that the materials have a Curie temperature of up to 900° C.

EXAMPLE 3

The performance of the accelerometer was tested on specially designed shakers and measurement consoles to determine the output sensitivity, frequency response, transverse sensitivity, and the thermal stabilities in sensitivity, resistance, and capacitance.

Figure 9:
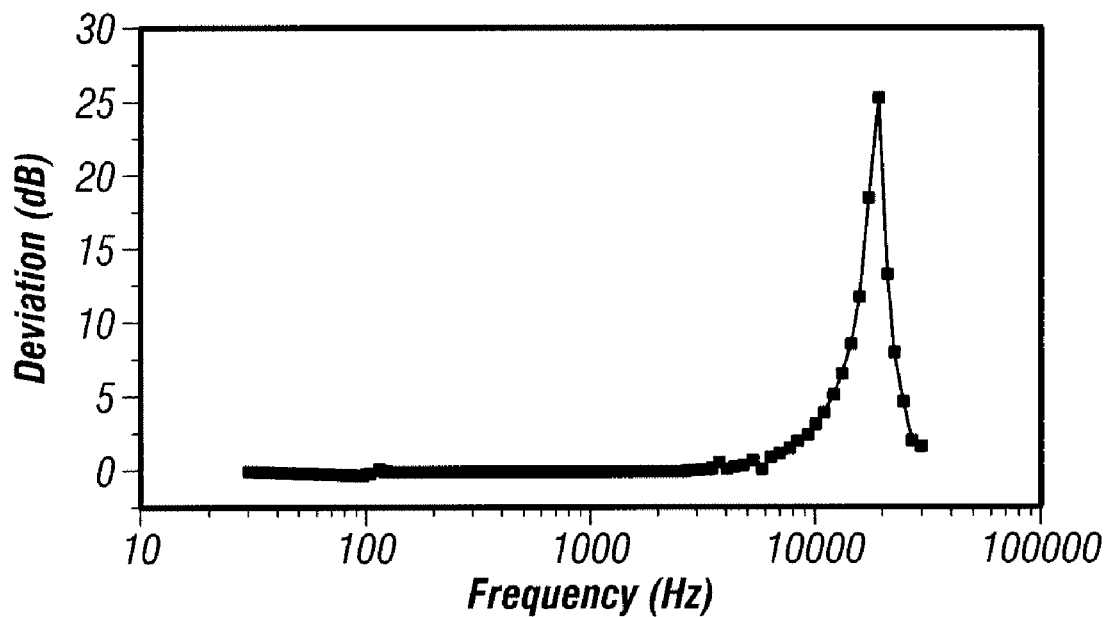
FIG. 9 shows the frequency response of the accelerometer subassembly in one of the embodiments that is made of the materials in the present invention.

FIG. 9 shows the frequency response of the embodiment accelerometers. The resonance frequency is up to 20,000 Hz and the ±1 dB bandwidth is up to 6,000 Hz.

Figure 10:
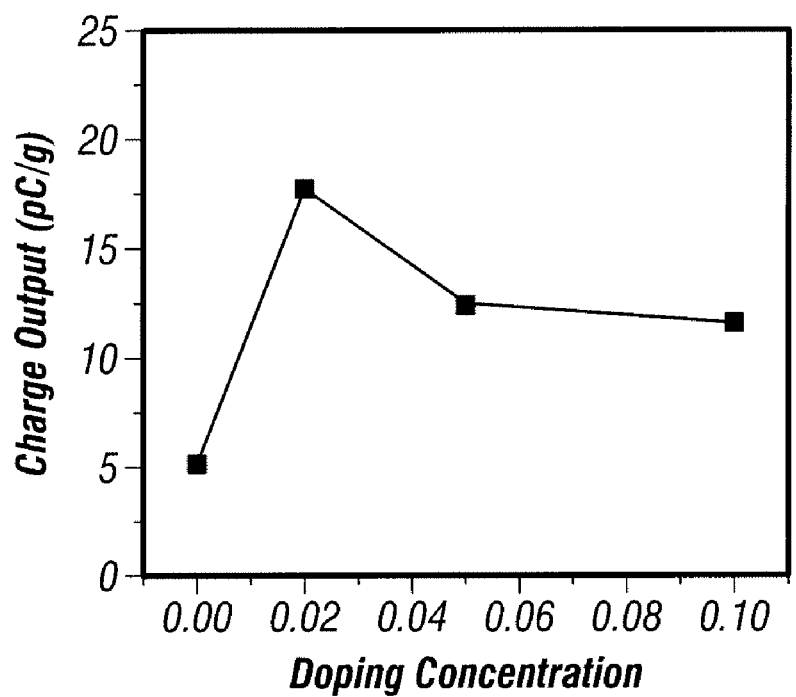
FIG. 10 shows the dependence of the output charge sensitivity of accelerometers on the doping levels of the materials that are used to build the sensors.

FIG. 10 is the dependence of charge outputs of the accelerometers on doping concentrations. The charge output can be tailored with differently doped materials and other approaches like changing the weight of the mass.

For dynamic measurements, it is imperative that the accelerometer does not produce significant response to lateral or transverse motion of the test object. The transverse response or transverse sensitivity of the accelerometer sensors, which is defined as the ratio of output caused by a transverse vibration to that caused by a longitudinal vibration, is lower than 5.0%, typically ~2.0% for the accelerometers made of the developed materials.

Figure 11:
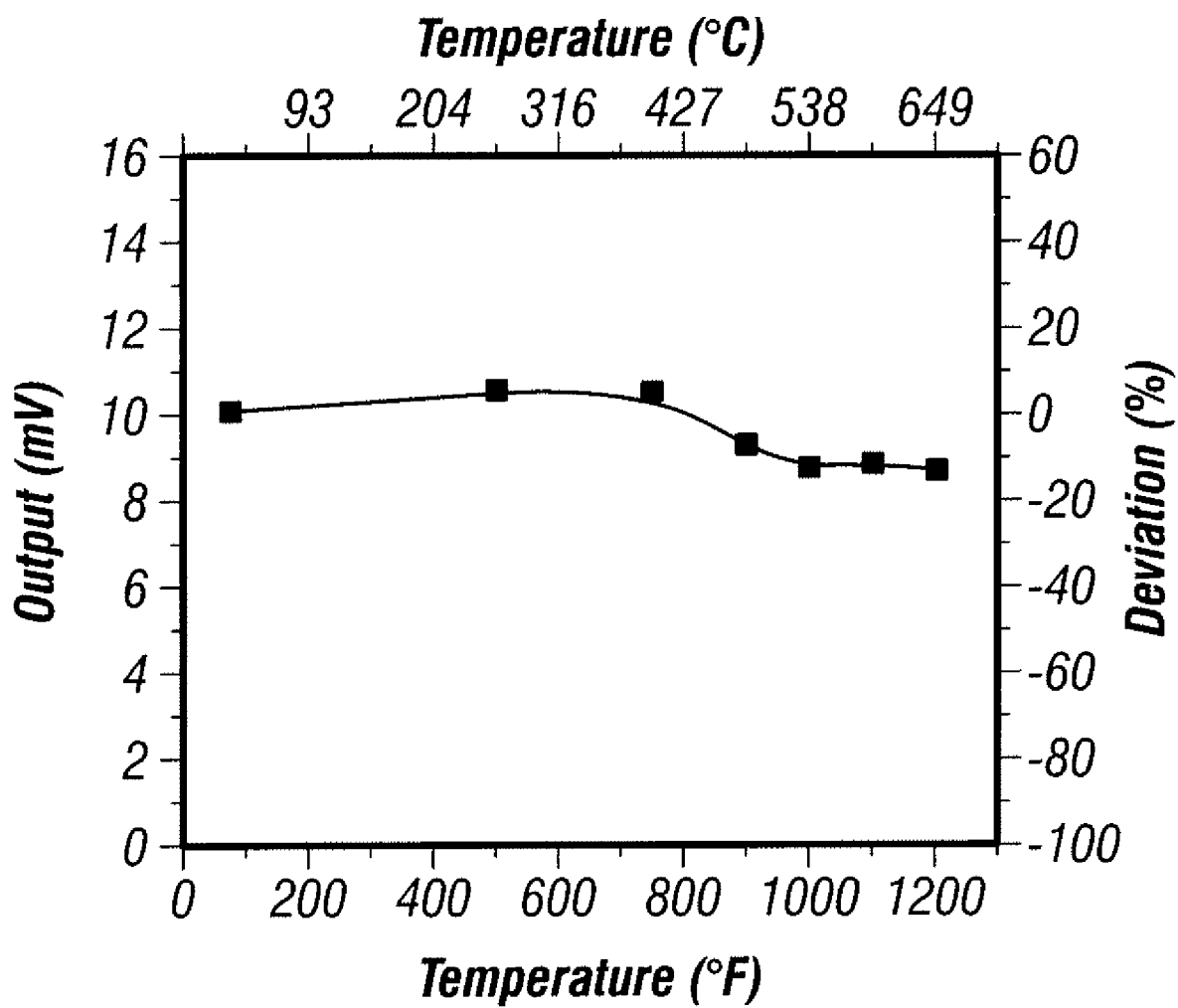
FIG. 11 shows the temperature dependence of the voltage output from the amplifier that is connected to the accelerometer of the present invention. It shows that the accelerometer can operate at up to 630° C.

The temperature dependence of the charge output of the accelerometer in the present invention is demonstrated in FIG. 11. It shows that the accelerometer can operate at up to 650° C. (1200° F.) with thermal deviation of ~10%.

It is acknowledged that while the invention has been described by way of examples and in terms of the specific embodiments, it is to be understood that the invention is not limited to the disclosed samples and embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A sensor subassembly, comprising;
a mass;
a crystal support structure;
a BLSP ceramic, wherein the ceramic has a formula of $[Bi_2O_2][A_{m-1}B_{m-x}M_xO_{3m+1}]$, where m=2, A is a mono-, di-, or trivalent ion or a combination thereof, and B is a transition element, M is a donor dopant or combination of different dopants and x is the molar fraction of the dopant or the combinations of dopants, wherein M and x are chosen to modify piezoelectric charge coefficient and resistivity of the ceramic;
the ceramic being mounted at the crystal support with a support member;
a first electrode and a second electrode coupled to the ceramic;
a first insulator positioned between the second electrode and the support member to isolate the ceramic and the crystal support,
a second insulator positioned between the first electrode and the mass to insulate the ceramic and the mass.

2. The sensor of claim 1, wherein the transition element is selected from the group consisting of $Fe^{3+}$, $Ti^{4+}$, $Nb^{5+}$, $Ta^{5+}$, $W^{6+}$, and $Mo^{6+}$ or combinations thereof.

3. The sensor of claim 1; wherein x is in the range of 0-15 mol. %.

4. The sensor of claim 1; wherein M is selected from at least one of, $Fe^{3+}$, $Ti^{4+}$, $Nb^{5+}$, $Ta^{5+}$, $W^{6+}$, $Mo^{6+}$ and combinations thereof.

5. The sensor of claim 1, wherein a x is adjusted from undoped to doped to increase the resistivity of the ceramic material.

6. The sensor of claim 1, wherein the ceramic has a piezoelectric coefficient of 3.5~10.2 pC/N.

7. The sensor of claim 1, wherein the ceramic material has a Curie temperature of 900~940° C.

8. The sensor subassembly of claim 1, wherein the ceramic is a stack of ceramics.

9. The sensor subassembly of claim 1, further comprising:
a fixation device that fixes the mass, first and second insulators, and ceramic onto the support structure through the support member.

10. The sensor subassembly of claim 1; wherein the sensor subassembly is positioned in a housing made of a high temperature metal or alloy.

11. The sensor subassembly of claim 10; wherein the metal or alloy housing can withstand temperatures up to 600° C.

12. The sensor subassembly of claim 10; wherein the metal or alloy housing can withstand temperatures up to 700° C.

13. The sensor subassembly of claim 10; wherein the metal or alloy housing can withstand temperatures up to 800° C.

14. The sensor subassembly of claim 1, wherein the sensor subassembly is configured to operate at temperatures up to 800° C. with a thermal deviation of no greater than 10%.

15. The sensor subassembly of claim 1, wherein the sensor is configured to operate at temperatures up to 700° C. with a thermal deviation of no greater than 10%.

16. The sensor subassembly of claim 1, wherein the sensor is configured to operate at temperatures up to 600° C. with a thermal deviation of no greater than 10%.

17. The sensor subassembly of claim 1, wherein the subassembly is configured in a sensor to measure at least one of, acceleration, shock, and vibration.

18. The sensor subassembly of claim 17, wherein a resonance frequency of the acceleration sensors is up to 20,000 Hz and the ±1 dB bandwidth is up to 6,000 Hz.

19. The sensor subassembly of claim 17, wherein a transverse response of the acceleration sensors is lower than 5.0%.

20. The sensor subassembly of claim 1, wherein the subassembly is configured in a sensor to measure dynamic force and pressure.

21. The sensor of claim 20, wherein the sensor has a vibration sensitivity no greater than 0.05 pC/g.

22. The sensor of claim 20, wherein the sensor is configured to operate at temperatures up to 800° C.

* * * * *